(12) United States Patent
Hildebrand et al.

(10) Patent No.: US 8,570,799 B2
(45) Date of Patent: Oct. 29, 2013

(54) MAGNETIC RANDOM ACCESS MEMORY WITH CONVERSION CIRCUITRY

(75) Inventors: Uwe Hildebrand, Fuerth (DE); Josef Hausner, Germering (DE); Matthias Obermeier, Duesseldorf (DE); Daniel Bergmann, Munich (DE)

(73) Assignee: Intel Mobile Communications GmbH, Neubiberg (DE)

( * ) Notice: Subject to any disclaimer, the term of this patent is extended or adjusted under 35 U.S.C. 154(b) by 111 days.

(21) Appl. No.: 13/210,460

(22) Filed: Aug. 16, 2011

(65) Prior Publication Data

US 2013/0044541 A1    Feb. 21, 2013

(51) Int. Cl.
*G11C 11/16* (2006.01)
(52) U.S. Cl.
USPC ........... 365/171; 365/154; 365/104; 365/156; 365/230.03; 711/102; 711/101; 711/104; 711/2; 711/163

(58) Field of Classification Search
USPC .............. 365/171, 154, 104, 156, 230.03; 711/102, 101, 104, 2, 163
See application file for complete search history.

(56) References Cited

U.S. PATENT DOCUMENTS

| | | | | |
|---|---|---|---|---|
| 4,896,262 A * | 1/1990 | Wayama et al. | | 710/65 |
| 5,230,058 A * | 7/1993 | Kumar et al. | | 710/13 |
| 5,576,987 A | 11/1996 | Ihara et al. | | |
| 5,829,012 A * | 10/1998 | Marlan et al. | | 711/102 |
| 5,923,582 A * | 7/1999 | Voss | | 365/154 |
| 6,649,953 B2 | 11/2003 | Cha | | |
| 7,428,619 B2 * | 9/2008 | Yasue et al. | | 711/150 |
| 7,747,287 B2 * | 6/2010 | Takayama et al. | | 455/566 |
| 2002/0109167 A1 | 8/2002 | Kang et al. | | |
| 2003/0214834 A1 | 11/2003 | Nagashima | | |
| 2007/0220374 A1 * | 9/2007 | Han | | 714/54 |

* cited by examiner

*Primary Examiner* — Connie Yoha
(74) *Attorney, Agent, or Firm* — Eschweiler & Associates, LLC (57) ABSTRACT

A magnetic random access memory is configured as a read/write memory and at least a first section of the magnetic random access memory is configured to be converted to a read only memory.

12 Claims, 5 Drawing Sheets

MAGNETIC RANDOM ACCESS MEMORY WITH CONVERSION CIRCUITRY

FIELD

The present invention relates to a magnetic random access memory, a magnetic random access memory device, a method for configuring a magnetic random access memory, and a data processing system.

BACKGROUND

In the field of embedded systems and battery powered devices very often processor chips are employed which comprise on-chip memory structures. In the case of, for example, mobile phones, such devices usually contain a microprocessor or micro-controller as well as a digital signal processor (DSP) wherein both of them may comprise their own memory structures. Such on-chip memory structures normally comprise ROM structures as well as RAM structures, in particular SRAM structures. The on-chip ROM is selected for on-chip applications like storing data or code that must not be changeable anymore because of, for example, security reasons such is the case for boot ROM supporting secure boot features. The on-chip ROM structures could also be used for well-defined signal processing core algorithms which are stable and do not need to be changed or updated. On the other hand, on-chip SRAM structures are selected, for example, for functioning as a working memory for reading and writing data or for some other data or code that potentially need to be changed or updated. An important aspect is that in these on-chip memories there is provided a well-defined split into on-chip SRAM or ROM so that certain areas are pre-defined as SRAM areas and ROM areas. This pre-defined split and the sizes of SRAM and ROM memories can not be changed later on without re-spin of the semiconductor chip. On the other hand situations may arise in which it would be desirable to have the possibility to flexibly extend or replace the SRAM and/or ROM memories.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

The aspects and embodiments are now described with reference to the drawings, wherein like reference numerals are generally utilized to refer to like elements throughout. In the following description, for purposes of explanation, numerous specific details are set forth in order to provide a thorough understanding of one or more aspects of the embodiments. It may be evident, however, to one skilled in the art that one or more aspects of the embodiments may be practiced with a lesser degree of the specific details. In other instances, known structures and elements are shown in schematic form in order to facilitate describing one or more aspects of the embodiments. It is to be understood that other embodiments may be utilized and structural or logical changes may be made without departing from the scope of the present invention. It should be noted further that the drawings are not to scale or not necessarily to scale.

In addition, while a particular feature or aspect of an embodiment may be disclosed with respect to only one of several implementations, such feature or aspect may be combined with one or more other features or aspects of the other implementations as may be desired and advantageous for any given or particular application. Furthermore, to the extent that the terms "include", "have", "with" or other variants thereof are used in either the detailed description or the claims, such terms are intended to be inclusive in a manner similar to the term "comprise". The terms "coupled" and "connected", along with derivatives may be used. It should be understood that these terms may be used to indicate that two elements co-operate or interact with each other regardless whether they are in direct physical or electrical contact, or they are not in direct contact with each other. Also, the term "exemplary" is merely meant as an example, rather than the best or optimal. The following detailed description, therefore, is not to be taken in a limiting sense, and the scope of the present invention is defined by the appended claims.

A magnetic random access memory (MRAM) is a memory device which comprises and utilizes a ferromagnetic material for storing information. The MRAM can, for example, function as a memory device for reading and writing information that relies upon forming multi-layer ferromagnetic thin films and sensing current variations that depend upon the magnetization direction of the respective thin films. The data storage in an MRAM can, for example, be achieved by using a giant magneto-resistive (GMR) phenomenon. A GMR device relies upon the variation in resistance that occurs when spin directions for two magnetic layers, having a non-magnetic layer there between, are different. According to another example, data storage in an MRAM can also be achieved by spin-polarized magneto-transmission (SPMT) in which spin influences electron transmission. The SPMT technique utilizes the phenomenon that larger currents are transmitted when spin directions are identical in two magnetic layers, having an insulating layer there between.

An SRAM memory is typically characterized in that it does not need to be periodically refreshed. It uses bistable latching circuitry to store each bit. Typically each bit in an SRAM is stored on four transistors that form two cross-coupled inverters.

A ROM memory is typically characterized by a non-volatile memory provided by, for example, a mask ROM whose contents are programmed by the integrated circuit manufacturer wherein regions of the chip are masked off during the process of photolithography. The functions of ROM are, for example, storage of program code and other non-volatile data. Data stored in ROM can not be modified, or can be modified only slowly or with difficulty, so it is mainly used to distribute firmware, i.e. software that is very closely tied to specific hardware.

Figure 1:
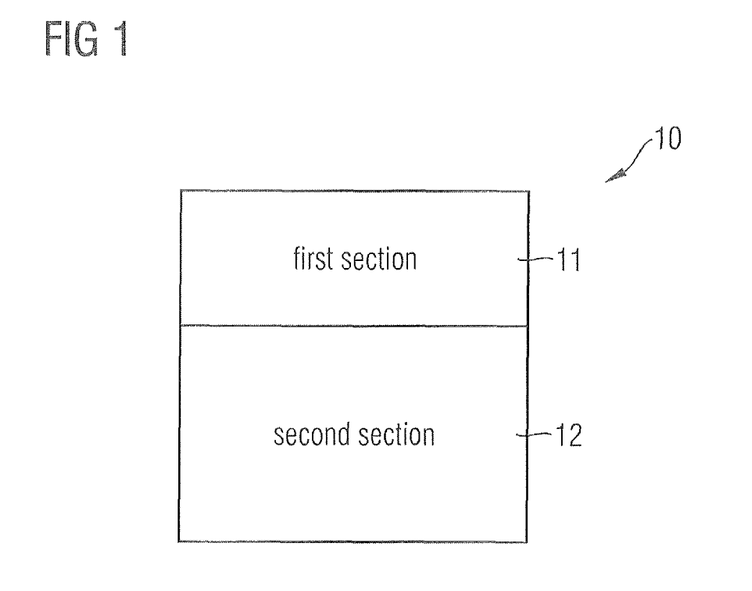
FIG. 1 shows a schematic block representation of a magnetic random access memory according to an embodiment.

Referring to FIG. 1, there is shown a schematic block representation of a magnetic random access memory according to an embodiment. The magnetic random access memory (MRAM) 10 of FIG. 1 is configured as a read/write memory and at least a first section 11 of the MRAM 10 is convertible to a read only memory.

According to an embodiment of the MRAM 10 of FIG. 1, as shown in FIG. 1, the MRAM 10 also comprises a second section 12 that is not convertible to a read only memory. In fact, however, the second section 12 can be virtually zero which means that the MRAM 10 is only comprised of the first section 11 so that in fact the whole MRAM 10 is convertible into a read only memory. On the other hand, it is also possible for an MRAM 10, as produced and delivered to a customer, that the MRAM 10 comprises a first section 11 that is convertible to a read only memory and a second section 12 that is already in the state of a read only memory having data stored in it by the manufacturer erasable or non-erasable. As a further embodiment thereof, it is also possible that the MRAM 10 comprises a third section that is not convertible to a read only memory.

According to an embodiment of the MRAM 10 of FIG. 1, the first section 11 is divided in a plurality of sub-sections that are individually convertible to a read only memory. The sub-sections may comprise a predetermined memory volume measured in units of bits or bytes.

According to an embodiment of the MRAM 10 of FIG. 1, the first section 11 or its sub-sections are convertible to a read only memory in a reversible manner, which means that those sub-sections having been converted to a read only memory can be converted back to a read/write memory at any desired time. According to another embodiment of the MRAM 10 of FIG. 1, the sub-sections are convertible to a read only memory in an irreversible manner so that the sub-sections can not be converted back to a read/write memory.

According to an embodiment of the MRAM 10 of FIG. 1, the first section 11 or sub-sections thereof are convertible by means of a conversion circuitry. Examples of such a conversion circuitry will be described further below. According to an embodiment, the first section 11 or sub-sections thereof are connected to the conversion circuitry.

Figure 2A:
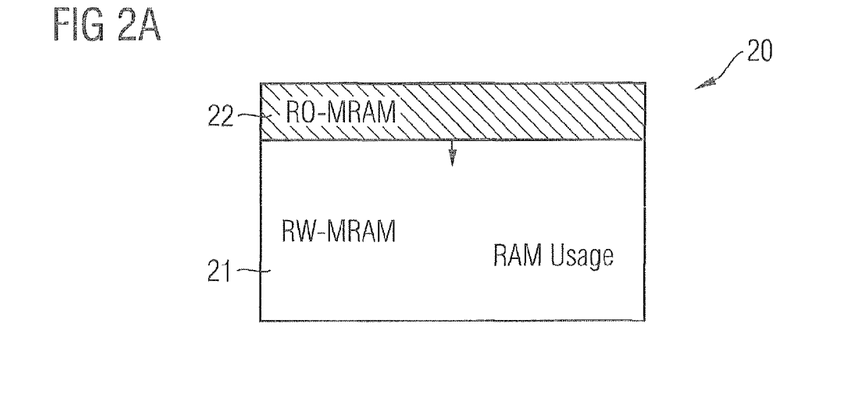
FIGS. 2a, 2b, and 2c show schematic block representations of a magnetic random access memory according to an embodiment, respectively.
Figure 2B:
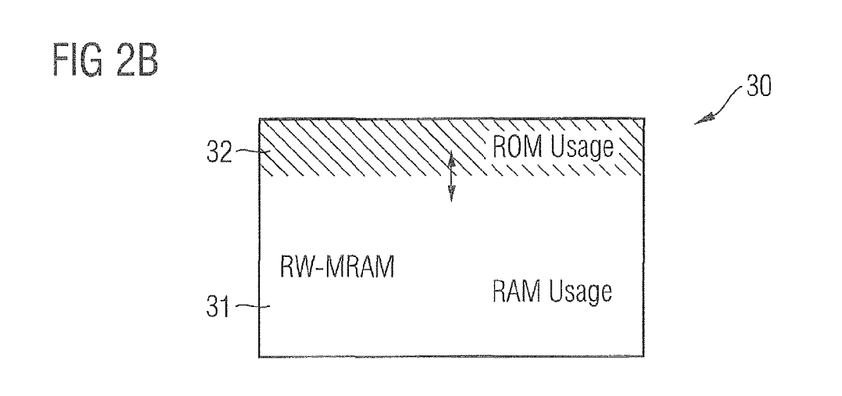
Figure 2C:
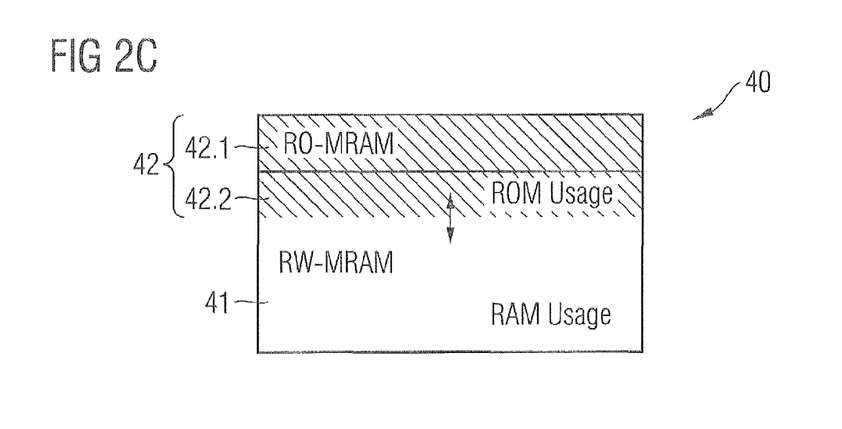

Referring to FIGS. 2a, 2b, and 2c, there are shown schematic block representations of embodiments of a magnetic random access memory, respectively. The embodiments as shown in FIGS. 2a, 2b, and 2c each show an MRAM either in a state in which the MRAM was produced and delivered to a customer or in a state the MRAM has taken after the customer has conducted one or more re-configurations of the MRAM. All embodiments of FIGS. 2a, 2b, and 2c show an MRAM, respectively, having a first memory section and a second memory section wherein the first memory section is comprised of a read/write memory and the second memory section is comprised of a read only memory.

According to an embodiment of the MRAM of FIGS. 2a, 2b, and 2c, the first memory section or at least one portion thereof is, or are, convertible to a read only memory. According to an embodiment thereof, the conversion is either reversible or irreversible, which means that a portion having been converted to a read only memory can either be converted back to a read/write memory or it can not be converted back to a read/write memory.

According to an embodiment of the MRAM of FIGS. 2a, 2b, and 2c, the MRAM further comprises a conversion circuitry configured to convert at least one sub-section of the first memory section to a read only memory. According to an embodiment thereof, the conversion circuitry can be arranged so that the conversion is either reversible or irreversible. Examples of the conversion circuitry will be described further below.

In the following the embodiments of FIGS. 2a, 2b, and 2c will be explained in some more detail. It should be stated that in all embodiments the characterization of a memory section as RAM/ROM usage means that the respective memory section is momentarily used as a RAM/ROM memory but a RAM can be converted to a ROM and vice versa.

Referring to FIG. 2a, there is shown a schematic block representation of a magnetic random access memory (MRAM) according to an embodiment. The MRAM 20 comprises a first memory section 21 configured as a read/write memory (RW-MRAM), the first memory section 21 comprising a first memory section volume. The MRAM 20 further comprises a second memory section 22 configured as read only memory (RO-MRAM), the second memory section 22 comprising a second memory section volume. The first and second memory section volumes are variable in that portions of the first memory section 21 are convertible to a read only memory so that those portions having been converted to a read only memory become part of the second memory section 22. There is a strict partition line between the first memory section 21 and the second memory 22 as indicated by the fat printed line. As it is further indicated by the arrow starting at this line and pointing into the first memory section 21, the conversion of portions of the first memory section 21 to a read only memory is irreversible, which means that those portions having been converted to a read only memory can not be converted back to a read/write memory. This concept is intended for applications requiring secure (i.e. irreversible) read only sections to be implemented in the MRAM 20. As the MRAM 20 normally does not have that property, additional or extended functions must be provided. The default operation mode of the as-produced or as-delivered MRAM is the read/write operation mode. The MRAM can then be incrementally changed into a read only mode of operation. Once a portion has been changed in such a way, it can not be reversed back to read/write in the embodiment of FIG. 2a. The MRAM can be gradually increased as needed and that may happen at different points in time, using the same version of a chip.

Referring to FIG. 2b, there is shown a schematic block representation of a magnetic random access memory according to an embodiment. The MRAM 30 of FIG. 2b comprises a first memory section 31 configured as a read/write memory (RW-MRAM), the first memory section 31 comprising a first memory section volume. The MRAM 30 further comprises a second memory section 32 configured as a read only memory, the second memory section 32 comprising a second memory section volume. The first and second memory section volumes are variable in that portions of the first memory section 31 are convertible to a read only memory so that those portions become part of the second memory section 32. There is also a partition line between the first and second memory sections 31 and 32. However, according to this embodiment and indicated by the double arrow, the conversion of portions of the first memory section 31 to a read only memory is reversible so that also portions of the second memory section 32 can be converted back to a read/write memory. The second memory section 32 can be virtually zero in an initial or as-produced MRAM 30. This concept is intended for applications that are not demanding secure (i.e. strictly not re-writable) sections to be implemented in MRAM structure, but rather aim for a fully flexible partitioning between RAM and ROM areas. The content of the second memory section 32 can still be changed at any desired moment. No additional mechanism is required for code patches, resulting in lower development effort for fixes and savings of patch memory.

Referring to FIG. 2c, there is shown a schematic block representation of a magnetic random access memory according to an embodiment. The MRAM 40 of FIG. 2c comprises a first memory section 41 configured as a read/write memory, the first memory section 41 comprising a first memory section volume. The MRAM 40 further comprises a second memory section 42, the second memory section 42 comprising a second memory section volume. The first and second memory section volumes are variable in that the second memory section comprises a first sub-section 42.1 and a second sub-section 42.2. The second sub-section 42.2 and the first memory section 41 are variable in that portions of the first memory section 41 are convertible in a reversible manner to a read only memory which means that those portions of the first memory section 41 can be converted back to a read/write memory. However, only the second sub-section 42.2 of the second memory section 42 can be converted into a read/write memory which means that the first sub-section 42.1 of the second memory section 42 can not be converted into a read/write memory. The second sub-section 42.2 can be virtually zero in an initial or as-produced MRAM 40.

Figure 3:
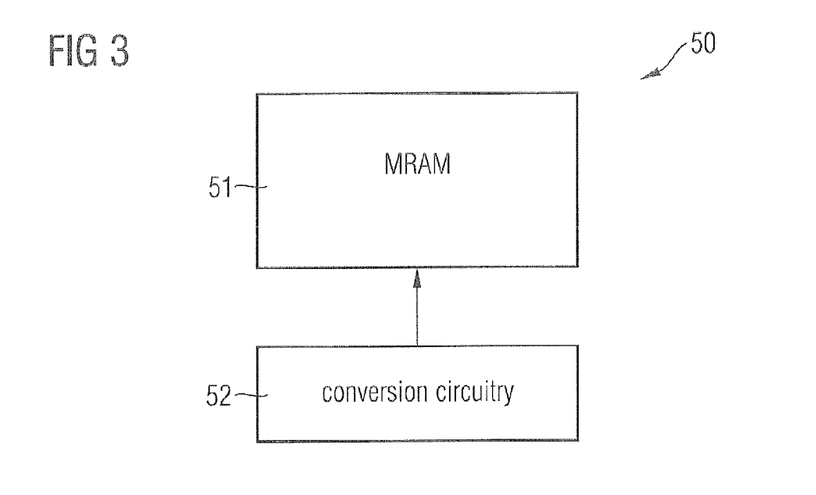
FIG. 3 shows a schematic block representation of a magnetic random access memory according to an embodiment.

Referring to FIG. 3, there is shown a schematic block representation of a magnetic random access memory (MRAM) device according to an embodiment. The magnetic random access memory device 50 of FIG. 3 comprises a magnetic random access memory (MRAM) 51 and a conversion circuitry 52 configured to convert at least one portion of the MRAM 51 to a read only memory.

According to an embodiment of the MRAM device 50, the conversion circuitry 52 is configured to convert the at least one portion in a reversible manner so that the at least one portion can always be converted back to a read/write memory. According to another embodiment of the MRAM device 50, the conversion circuitry 52 is configured to convert the at least one portion in an irreversible manner so that the at least one portion can not be converted back to a read/write memory.

According to an embodiment of the MRAM device 50, the MRAM device 50 comprises at least one write line, and the conversion circuitry 52 comprises a fuse electrically connected with or within the write line. More specifically, a first section of the write line is connected with an input of the fuse and a second section of the write line is connected with an output of the fuse and with an input of the MRAM 51 so that the fuse is integrated within the write line and blowing the fuse means interrupting the write line so that the write line is no longer able to transmit any electrical signals to the MRAM 51. Such an embodiment would be an example for an irreversible conversion to a read only memory.

According to an embodiment of the MRAM device 50, the conversion circuitry 52 comprises a storage medium, the storage medium having stored an information on whether a particular portion of the MRAM 51 can be written upon or not. According to an embodiment thereof, the storage medium of the conversion circuitry 52 comprises a plurality of bit positions, wherein each one of the bit positions is associated with one portion of the MRAM 51. In particular, a binary value stored at one bit position determines whether the associated portion of the MRAM 51 can be written upon or not. In practice the respective bit position could be read out and supplied to a logic circuitry that is also connected with the write line. Such an embodiment would be an example for a reversible conversion to a read only memory.

According to an embodiment of the MRAM device 50, the MRAM 51 comprises first and second memory sections wherein the memory volumes of the first and second memory sections are variable, in particular variable with respect to each other. According to an embodiment, the first memory section comprises a first memory section volume and the second memory section comprises a second memory section volume and the first and second memory section volumes are variable in a reverse manner, which means that an increase of the first memory section volume is accompanied by a decrease of the second memory section volume, wherein in particular the amount of the increase of the first memory section volume equals the amount of the decrease of the second memory section volume. According to another embodiment, the sum of the first and second memory section volumes is invariable wherein in particular a total memory volume of the MRAM 51 corresponds to the sum of the first and second memory section volumes.

Figure 4:
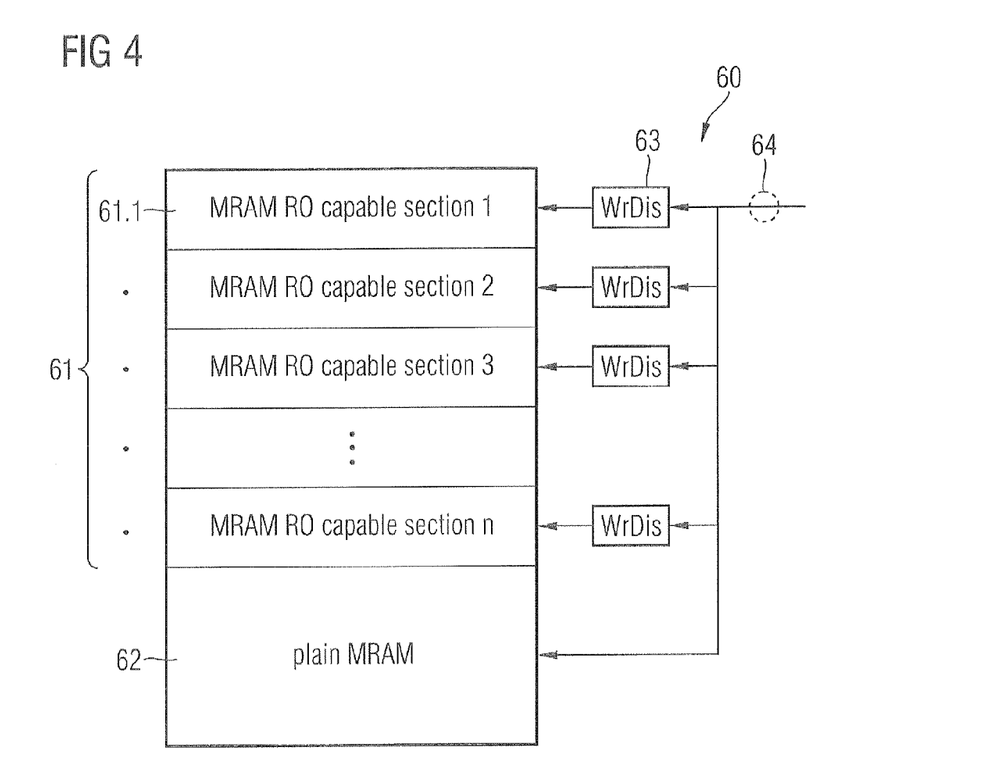
FIG. 4 shows a schematic block representation of a magnetic random access memory according to an embodiment.

Referring to FIG. 4, there is shown a schematic block representation of a magnetic random access memory according to an embodiment. The magnetic random access memory (MRAM) 60 of FIG. 4 comprises a first memory section 61 convertible to a read only memory and a second memory section 62 not convertible to a read only memory. The first memory section 61 is divided into a number of read only capable sections 61.1. The first memory section 61 is divided into a plurality of RO capable sections 61.1. The MRAM 60 is connected with a write signal line 64 wherein the write signal line 64 is directly connected with the second memory section 62 and the write signal line 64, in one embodiment, comprises a plurality of lines connected with the RO capable sections 61.1 of the first memory section 61 via intermediate write disable elements 63. More specifically, the write signal line 64 is connected with an input of one of the write disable elements 63 and an output of the write disable element 63 is connected with an input of one RO capable section 61.1 of the first memory section 61. The write disable elements 63, for example, can be realized by fuses. Each one of the fuses can be individually addressed and blown by supplying it with a current that exceeds a certain threshold value. When a fuse is blown, the write signal line 64 is irreversibly interrupted with respect to that section 61.1 so that the respective associated RO capable section 61.1 is irreversibly converted to a read only memory as any write signal transmitted on the write line 64 is effectively blocked or gated by the interrupted write line.

Figure 5:
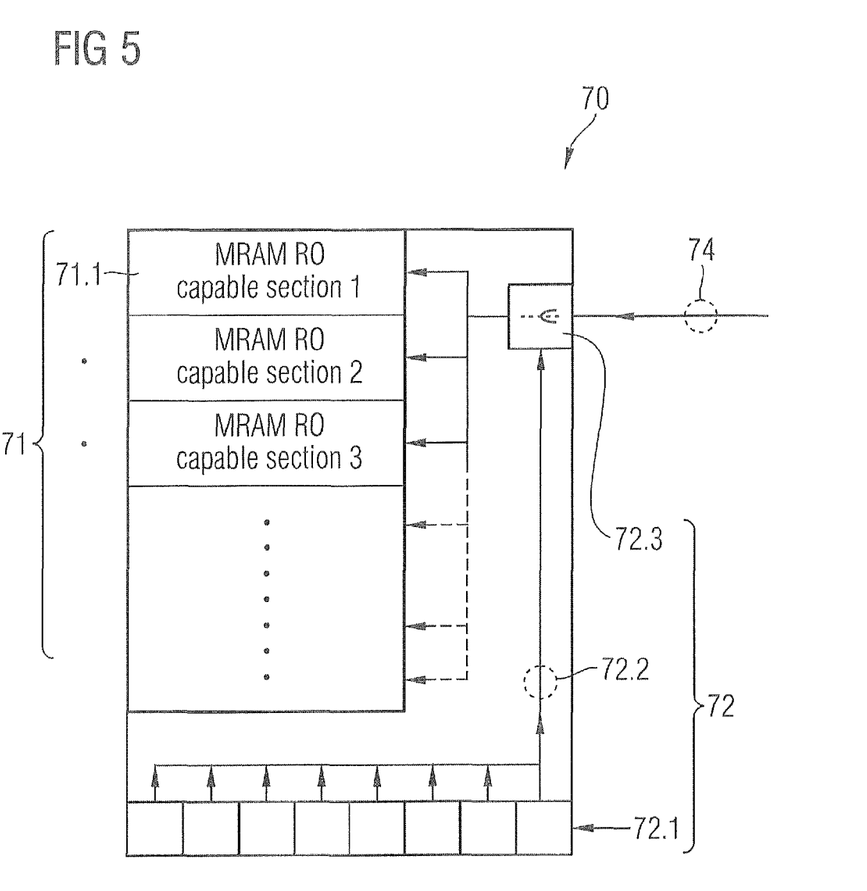
FIG. 5 shows a schematic block representation of a magnetic random access memory according to an embodiment.

Referring to FIG. 5, there is shown a schematic block representation of a magnetic random access memory according to an embodiment. The magnetic random access memory (MRAM) 70 of FIG. 5 comprises a memory section 71 configured as a read/write memory and a conversion circuitry 72 configured to convert at least one portion of the memory section 71 to a read only memory. The memory section 71 is divided in a plurality of sub-sections 71.1. The conversion circuitry 72 comprises a storage medium 72.1, the storage medium 72.1 comprising a plurality of bit positions, each one of the bit positions being associated with one sub-section 71.1 of the memory section 71. The storage medium 72.1 and its individual bit positions are connected with a read-out line 72.2 that is connected with a first input of a logic device 72.3. A write signal line 74 is connected with a second input of the logic device 72.3. An output of the logic device 72.3 is connected with the individual sub-sections 71.1 of the MRAM device 70. The logic device 72.3 functions in such a way that applying a first binary value, e.g. "1", to the first input of the logic device 72.3 has the effect that any signal applied to the second input is fed through to the output of the logic device 72.3 and applying a second binary value, e.g. "0", to the first input has the effect that any signal applied to the second input is blocked so that no signal is present at the output of the logic device 72.3. If an arbitrary sub-section 71.1 of the first memory section 71 is to be converted to a read only memory, the associated bit position of the storage medium 72.1 is set to "0". Assuming that a write signal addressed to this particular sub-section arrives at the second input of the logic device 72.3, the read-out bit "0" of the bit position associated with this particular sub-section is applied to the first input of the logic device 72.3. As a consequence, due to the function of the logic device 72.3, the signal supplied on the write signal line 74 is effectively blocked. On the other hand, if a "1" is stored on a bit position of the storage medium 72.1 associated with some other sub-section 71.1 of the first memory section 71, then a signal supplied on the write signal line 74 will be effectively passed by the logic device 72.3 to the respective sub-section 71.1 so that the data supplied on the write signal line 74 can be written on the respective sub-section 71.1. As a consequence, as long as a "1" is stored in the storage medium 72.1, the respective sub-section 71.1 functions as a read/write memory and when the bit position is changed to "0" the respective sub-section is converted to a read only memory in a reversible manner. The logic device 72.3 can be realized, for example, by a transistor.

The embodiment as described above and depicted in FIG. 5 thus shows an example of a reversible conversion of a section of the MRAM into a read only memory. If, for whatever reason, it is decided that a sub-section 71.1 should be converted back to a read/write memory, the respective associated bit position of the storage medium 72.1 is to be changed to "1". Of course it is necessary to arrange appropriate control means for changing the values of the bit positions of the storage medium 72.1 which are not shown here for reasons of simplicity and which can easily be implemented by any person skilled in the art.

Figure 6:
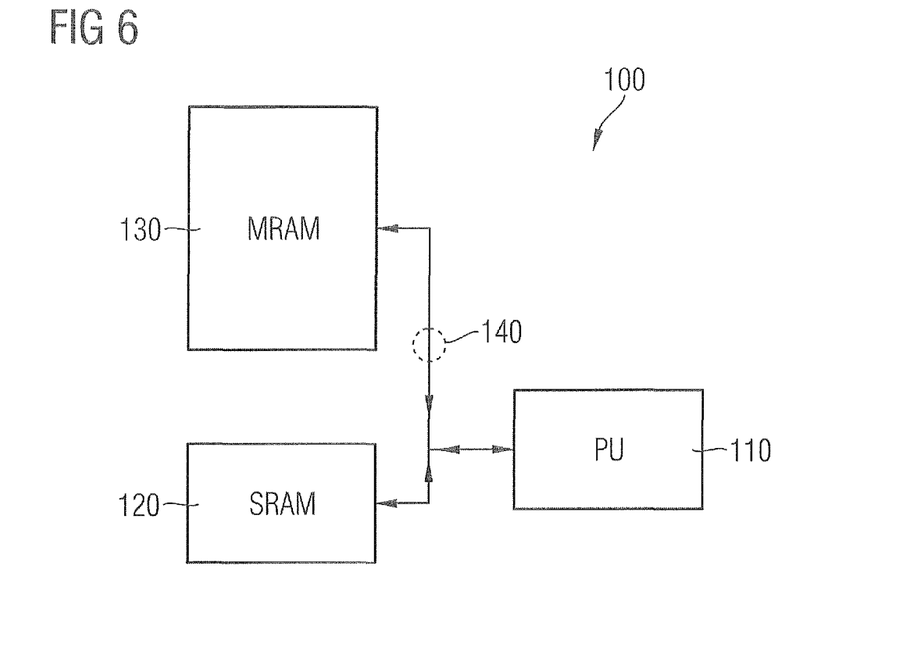
FIG. 6 shows a schematic block representation of a data processing system according to an embodiment.

Referring to FIG. 6, there is shown a schematic block representation of a data processing system according to an embodiment. The data processing system 100 comprises a processing unit (PU) 110, a static random access memory (SRAM) 120, a magnetic random access memory (MRAM) 130, and a bus system 140 connecting the processing unit 110, the SRAM 120 and the MRAM 130 with each other. The static random access memory (SRAM) 120 can also be omitted or can be replaced by a ROM memory, like a conventional ROM memory.

According to an embodiment of the data processing system 100 of FIG. 6, the magnetic random access memory 130 is configured as a read/write memory and at least a first section of the MRAM 130 is convertible to a read only memory. Further embodiments can be formed with anyone of the features of the afore-described embodiments of a magnetic random access memory.

According to an embodiment of the data processing system 100 of FIG. 6, the system further comprises a conversion circuitry configured to convert at least a first sub-section of the first section to a read only memory. Further embodiments can be formed with anyone of the features of the afore-described embodiments of a magnetic random access memory.

According to an embodiment of the data processing system 100 of FIG. 6, the processing unit 110 is a digital signal processor which is in particular the case, if the data processing system is incorporated within and part of a communication unit like a mobile communication unit. According to a further embodiment thereof, the SRAM 120 is implemented as a working memory for data that need to be read/write. The MRAM 130 could be organized and configured such that a first section functions as a read/write memory, in particular also as a working memory, and a second section functions as a read only memory consisting of memory portions that have been converted from previous read/write memory portions into read only memory portions and that store data or code that should be maintained for some pre-determined time period but need to be changed or updated between these pre-determined time periods. For example, in a mobile communication unit these may be data or code that are to be maintained during a telephone call or other communication connections but may be changed after terminating the connection.

According to an embodiment of the data processing system 100 of FIG. 6, the processing unit 110, the static random access memory 120 and the magnetic random access memory 130 are integrated on one and the same semiconductor chip.

According to an embodiment of the processing system 100 of FIG. 6, the processing unit 110 is a microprocessor or a micro-controller. According to an embodiment thereof, the MRAM 130 may comprise a first section configured as a read/write memory and a second section configured as a read only memory and the second section has stored some customer specific data or code. An advantage of this approach is, in particular, that only the customer specific parts applicable for the individual target system need to be implemented. A real ROM structure-based implementation would require that customer specific implementations of all considered customers need to be taken into account already during chip design.

According to an embodiment of the data processing system 100 of FIG. 6, the bus system 140 is bi-directional so that the processor unit 110, the SRAM 120 and the MRAM 130 can freely exchange data between each other.

Figure 7:
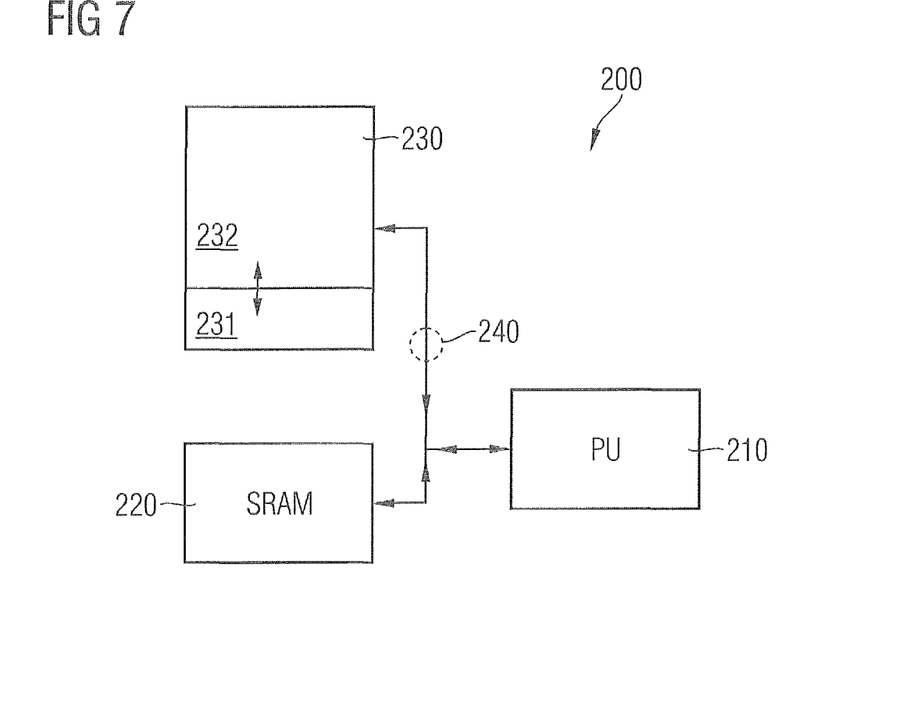
FIG. 7 shows a schematic block representation of a data processing system according to an embodiment.

Referring to FIG. 7, there is shown a schematic block representation of a data processing system according to an embodiment. The data processing system 200 of FIG. 7 comprises a processing unit 210, a static random access memory (SRAM) 220, a magnetic random access memory (MRAM) 230, and a bus system 240 connecting the processing unit 210, the SRAM 220 and the MRAM 230 with each other. The static random access memory (SRAM) 220 can also be omitted or can be replaced by a ROM memory, like a conventional ROM memory.

The data processing system 200 of FIG. 7 represents a further embodiment of the data processing system 100 of FIG. 6. In particular, the MRAM 230 is characterized by having a flexible RAM/ROM partitioning as described in previous embodiments related to MRAM structures. The flexible RAM/ROM partitioning is symbolized by a partition line separating a first memory section 231 from a second memory section 232 of the MRAM 230. The first memory section 231 is configured as a read/write memory and the second memory section 232 is configured as a read only memory. The drawn-in double arrow crossing the partition line between the first memory section 231 and the second memory section 232 symbolizes the possibility of shifting the partition line so that the memory volumes of the first memory section 231 and the second memory section 232 are variable with respect to each other, namely variable in a manner so that the sum of both memory volumes is kept constant. The MRAM 230 may comprise any further feature described previously in connection with embodiments related to MRAM structures. In particular, the MRAM 230 may comprise a conversion circuitry for converting portions of the first memory section 231 to read only memory portions.

In a method for re-configuring a magnetic random access memory (MRAM), the MRAM is configured as a read/write memory and the method comprises converting at least a first section of the MRAM to a read only memory.

According to an embodiment of the method, customer specific data or code are stored into such read only memory portion. According to another embodiment, mathematic algorithms are stored into such read only memory section.

According to an embodiment of the method, converting is conducted in a reversible or an irreversible manner.

According to an embodiment of the method, converting is conducted by means of a conversion circuitry.

Further embodiments of the method can be formed with features as described in connection with the above embodiments of MRAM structures.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

What is claimed is:

1. A magnetic random access memory device, comprising:
   a magnet random access memory configured as a read/write memory, and
   a conversion circuitry configured to convert at least a first section of the magnet random access memory to a read only memory,
   wherein the conversion circuitry is configured to convert the at least first section to the read only memory in an irreversible manner, and
   wherein the device further comprises at least one write line, and the conversion circuitry comprises a fuse electrically connected to the write line.

2. A magnetic random access memory device, comprising:
   a magnet random access memory configured as a read/write memory, and
   a conversion circuitry configured to convert at least a first section of the magnet random access memory to a read only memory,
   wherein the conversion circuitry is configured to convert the at least first section to the read only memory back to the read/write memory in a reversible manner, and
   wherein the conversion circuitry comprises a storage medium configured to store an information indicating whether a section of the first memory section can be written upon or not.

3. The magnetic random access memory device according to claim 2, wherein the storage medium comprises a plurality of bit positions, wherein each one of the bit positions is associated with one section of the magnetic random access memory.

4. A data processing system, comprising:
   a semiconductor chip,
   a processing unit,
   a magnetic random access memory,
   a static random access memory, and
   a bus system connecting the processing unit, the static random access memory, and the magnetic random access memory with each other,
   wherein the magnetic random access memory and the static random access memory are integrated on the semiconductor die.

5. The data processing system according to claim 4, wherein the magnetic random access memory is configured as a read/write memory and at least a first section of the magnetic random access memory is configured to be converted to a read only memory.

6. The data processing system according to claim 4, further comprising:
   a conversion circuitry configured to convert at least a first section of the magnetic random access memory to a read only memory.

7. The data processing system according to claim 4, wherein the processing unit is a digital signal processor.

8. The data processing system according to claim 7, wherein mathematical algorithms are stored in a section of the magnetic random access memory that is converted to a read only memory.

9. The data processing system according to claim 4, wherein the processing unit is a microprocessor or a microcontroller.

10. The data processing system according to claim 9, wherein customer specific data are stored in a section of the magnetic random access memory that is converted to a read only memory.

11. The data processing system according to claim 9, wherein secure boot features are stored in a section of the magnetic random access memory that is converted to a read only memory.

12. A magnetic random access memory device, comprising:
    a magnetic random access memory comprising a first section and a second section, wherein the first section is configured as a read/write memory and the second section is configured as a read only memory, the second section having stored customer specific data or code, and
    a conversion circuitry configured to convert at least a part of the first section of the magnet random access memory to a read only memory.

* * * * *